United States Patent
Liao et al.

(10) Patent No.: US 10,930,751 B2
(45) Date of Patent: Feb. 23, 2021

(54) FERROELECTRIC ASSEMBLIES

(71) Applicant: Micron Technology, Inc., Boise, ID (US)

(72) Inventors: Albert Liao, Boise, ID (US); Manzar Siddik, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/843,402

(22) Filed: Dec. 15, 2017

(65) Prior Publication Data

US 2019/0189768 A1 Jun. 20, 2019

(51) Int. Cl.
| | |
|---|---|
| *H01L 29/51* | (2006.01) |
| *H01L 27/115* | (2017.01) |
| *G11C 11/22* | (2006.01) |
| *H01L 29/40* | (2006.01) |
| *H01L 21/28* | (2006.01) |

(52) U.S. Cl.
CPC .......... *H01L 29/516* (2013.01); *G11C 11/221* (2013.01); *G11C 11/223* (2013.01); *H01L 29/40111* (2019.08)

(58) Field of Classification Search
CPC .................................................. H01L 27/11502
See application file for complete search history.

(56) References Cited

U.S. PATENT DOCUMENTS

| | | | | |
|---|---|---|---|---|
| 5,471,364 A | * | 11/1995 | Summerfelt | H01G 4/306 257/295 |
| 6,350,643 B1 | | 2/2002 | Hintermaier et al. | |
| 6,674,109 B1 | * | 1/2004 | Fujimori | H01L 29/516 257/295 |
| 6,953,721 B2 | * | 10/2005 | Agarwal | H01L 21/02183 257/E21.009 |
| 9,876,018 B2 | | 1/2018 | Chavan et al. | |
| 2001/0041372 A1 | | 11/2001 | Arita et al. | |
| 2003/0142533 A1 | * | 7/2003 | Ueda | G11C 11/22 365/145 |
| 2005/0184328 A1 | | 8/2005 | Uchiyama et al. | |
| 2005/0269613 A1 | | 12/2005 | Li et al. | |

(Continued)

FOREIGN PATENT DOCUMENTS

| | | |
|---|---|---|
| TW | 201730922 | 9/2017 |
| TW | 201742235 | 12/2017 |

(Continued)

*Primary Examiner* — Omar F Mojaddedi
(74) *Attorney, Agent, or Firm* — Wells St. John P.S.

(57) ABSTRACT

Some embodiments include ferroelectric assemblies. Some embodiments include a capacitor which has ferroelectric insulative material between a first electrode and a second electrode. The capacitor also has a metal oxide between the second electrode and the ferroelectric insulative material. The metal oxide has a thickness of less than or equal to about 30 Å. Some embodiments include a method of forming an assembly. A first capacitor electrode is formed over a semiconductor-containing base. Ferroelectric insulative material is formed over the first electrode. A metal-containing material is formed over the ferroelectric insulative material. The metal-containing material is oxidized to form a metal oxide from the metal-containing material. A second electrode is formed over the metal oxide.

8 Claims, 5 Drawing Sheets

(56) References Cited

U.S. PATENT DOCUMENTS

| | | | | |
|---|---|---|---|---|
| 2006/0102983 A1* | 5/2006 | Iijima | ............... | H01L 21/02178 |
| | | | | 257/532 |
| 2007/0052065 A1* | 3/2007 | Kanaya | ............. | H01L 27/11502 |
| | | | | 257/532 |
| 2008/0048226 A1* | 2/2008 | Heo | .................. | H01L 27/11502 |
| | | | | 257/295 |
| 2009/0309188 A1* | 12/2009 | Wang | ................ | H01L 27/11502 |
| | | | | 257/532 |
| 2010/0000673 A1* | 1/2010 | Masuda | .................. | H01L 28/55 |
| | | | | 156/280 |
| 2015/0214322 A1* | 7/2015 | Mueller | ................ | H01L 29/516 |
| | | | | 257/295 |
| 2016/0365133 A1* | 12/2016 | Ino | ........................ | G11C 11/223 |
| 2017/0162587 A1 | 6/2017 | Chavan et al. | | |
| 2017/0345831 A1 | 11/2017 | Chavan et al. | | |

FOREIGN PATENT DOCUMENTS

TW           107144920           12/2019
WO                  WO              4/2019
     PCT/US2018/063743

* cited by examiner

FERROELECTRIC ASSEMBLIES

TECHNICAL FIELD

Ferroelectric assemblies and methods of forming ferroelectric assemblies. In some applications, ferroelectric capacitors and methods of forming ferroelectric capacitors.

BACKGROUND

Capacitors are electrical components that may be used in integrated circuitry. A capacitor has two electrical conductors separated by electrically insulating material. Energy as an electric field may be electrostatically stored within such material.

A ferroelectric capacitor has ferroelectric material as at least part of the insulating material. Ferroelectric materials are characterized by having two stable polarized states. The polarization state of the ferroelectric material can be changed by application of suitable programming voltages, and remains after removal of the programming voltage (at least for a time).

In some applications, capacitors may be utilized in memory/storage. For instance, ferroelectric capacitors may be incorporated into ferroelectric random access memory (FeRAM).

FeRAM may have many attractive features, including nonvolatility, low power consumption, high-speed operation, etc. However, difficulties are encountered in fabricating highly-integrated memory comprising FeRAM. It is desired to develop new capacitors suitable for utilization in FeRAM, and new methods of fabricating FeRAM.

Ferroelectric materials may be utilized in other assemblies besides capacitors. For instance, ferroelectric materials may be utilized in ferroelectric field effect transistors (FeFETs) and ferroelectric tunnel junction (FTJ) devices. It is desired to develop improvements which may be utilized across a broad range of ferroelectric assemblies; including, for example, ferroelectric capacitors, FeFETs and FTJ devices.

DETAILED DESCRIPTION OF THE ILLUSTRATED EMBODIMENTS

Some aspects include recognition that a problem with conventional ferroelectric capacitors is that there may be oxygen vacancies within the ferroelectric material, and particularly along an interface between the ferroelectric material and an upper electrode formed across the ferroelectric material. The oxygen vacancies may adversely affect performance of the ferroelectric capacitors, and in some applications may adversely affect performance of memory/storage (for instance, FeRAM) utilizing the ferroelectric capacitors. Some embodiments include methods of forming ferroelectric capacitors in which reactive metal is provided across ferroelectric material and subsequently oxidized, with such oxidation including flow of oxygen into underlying ferroelectric material to decrease the number of oxygen vacancies within the ferroelectric material (or at least within an upper region of the ferroelectric material). An upper electrode may then be formed across the oxidized reactive metal, and the ferroelectric material may retain desired operating characteristics associated with ferroelectric material having relatively few oxygen vacancies along an interface adjacent the upper electrode. The oxidized metal remaining in the final capacitor construction may distinguish capacitors formed utilizing the methodology described herein from capacitors formed utilizing conventional methods; and some embodiments include ferroelectric capacitors having oxidized metal between at least a portion of an upper electrode and a ferroelectric material. The problem of oxygen vacancies may occur in other ferroelectric assemblies besides capacitors (for example, in FeFETs and FTJ devices), and embodiments described herein may be suitable for utilization with a broad range of ferroelectric assemblies.

Example methods and structures are described with reference to FIGS. 1-10.

FIGS. 1-5 describe an example process for fabricating example ferroelectric assemblies.

Figure 1:
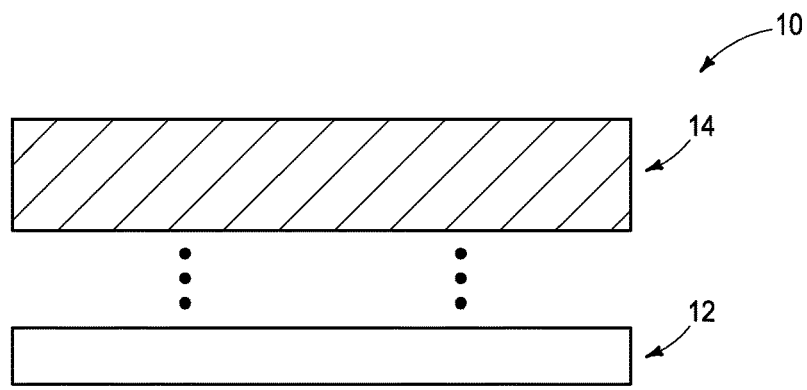
FIGS. 1-5 are diagrammatic cross-sectional views of a construction at example process stages of an example method for fabricating a ferroelectric device.

Referring to FIG. 1, a construction 10 comprises an electrode 14 supported by a base 12.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is shown between the base 12 and the electrode 14. Such gap is utilized to diagrammatically indicate that there may be additional structures or materials provided between the base 12 and the electrode 14. For instance, in some applications the electrode 14 may be incorporated into a ferroelectric capacitor which is one of numerous substantial identical ferroelectric capacitors within a memory array (with the term "substantially identical" meaning identical to within reasonable tolerances of fabrication and measurement). The individual capacitors may be electrically coupled with transistors, and may be accessed utilizing digit lines and wordlines. The transistors, digit lines and/or wordlines may be in whole, or at least in part, provided between the base 12 and the electrode 14.

The electrode 14 may comprise any suitable composition or combination of combinations; such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the electrode 14 may comprise, consist essentially of, or consist of titanium nitride.

The electrode 14 may have any suitable thickness; and in some embodiments may have a thickness within a range of from about 10 angstroms (Å) to about 200 Å.

Figure 2:
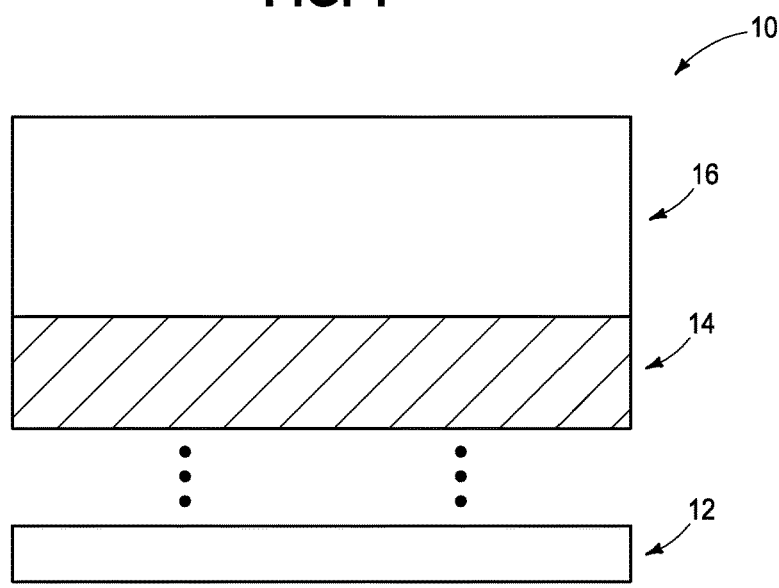

Referring to FIG. 2, insulative material 16 is formed over the electrode 14. The insulative material 16 may be referred to as capacitor insulative material in some embodiments. At least some of the insulative material 16 comprises ferroelectric insulative material, and in some embodiments an entirety of the insulative material 16 is ferroelectric insulative material.

The ferroelectric insulative material may comprise any suitable composition or combination of compositions; and in some example embodiments may include one or more of transition metal oxide, zirconium, zirconium oxide, niobium, niobium oxide, hafnium, hafnium oxide, lead zirconium titanate, and barium strontium titanate. Also, in some example embodiments the ferroelectric insulative material may have dopant therein which comprises one or more of silicon, aluminum, lanthanum, yttrium, erbium, calcium, magnesium, strontium, and a rare-earth element.

The insulative material 16 may be formed to any suitable thickness; and in some embodiments may have a thickness within a range of from about 30 Å to about 250 Å.

Figure 3:
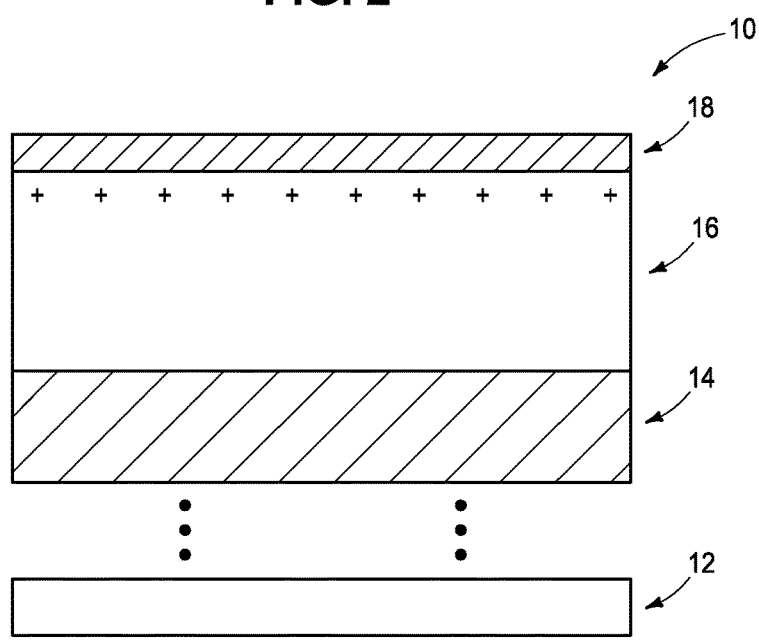

Referring to FIG. 3, metal-containing material 18 is formed over the insulative material 16. In the shown embodiment, oxygen vacancies (represented by the symbol "+") are within a region of the insulative material along an interface with the metal 18. The oxygen vacancies may be within oxide of the ferroelectric insulative material. Although the oxygen vacancies are shown only along the interface with the metal-containing material 18, it is to be understood that the oxygen vacancies may also extend deeper within the insulative material 16 than shown in FIG. 3. However, it is generally the oxygen vacancies along the upper interface of the insulative material 16 which are most problematic.

The oxygen vacancies may be generated during or after the metal-containing material 18 is formed due to oxygen being pulled from insulative material 16 to oxidize regions of the metal-containing material 18 adjacent the insulative material 16. Alternatively, the oxygen vacancies may result from other processes. Regardless, the oxygen vacancies may be problematic to the extent that such remain in a final ferroelectric assembly (e.g., capacitor, FeFET, FTJ device, etc.) comprising the insulative material 16.

The metal-containing material 18 may comprise any suitable composition or combination of compositions; and in some embodiments may comprise, consist essentially of, or consist of one or more of titanium, aluminum, ruthenium, niobium and tantalum. The metal-containing material 18 may additionally comprise one or more of nitrogen, carbon, silicon and germanium.

In some embodiments, it is found that it may be desirable for the metal-containing material 18 to include titanium; and in some example embodiments the metal-containing material 18 may comprise, consist essentially of, or consist of titanium.

The metal-containing material 18 may be kept relatively thin; and in some embodiments may have a thickness of less or equal to about 30 Å. For instance, in some embodiments the metal-containing material 18 may have a thickness within a range of from about one monolayer to about 20 Å. The metal-containing material 18 may be formed to be a continuous layer (as shown), or may be formed to be a discontinuous film.

Figure 4:
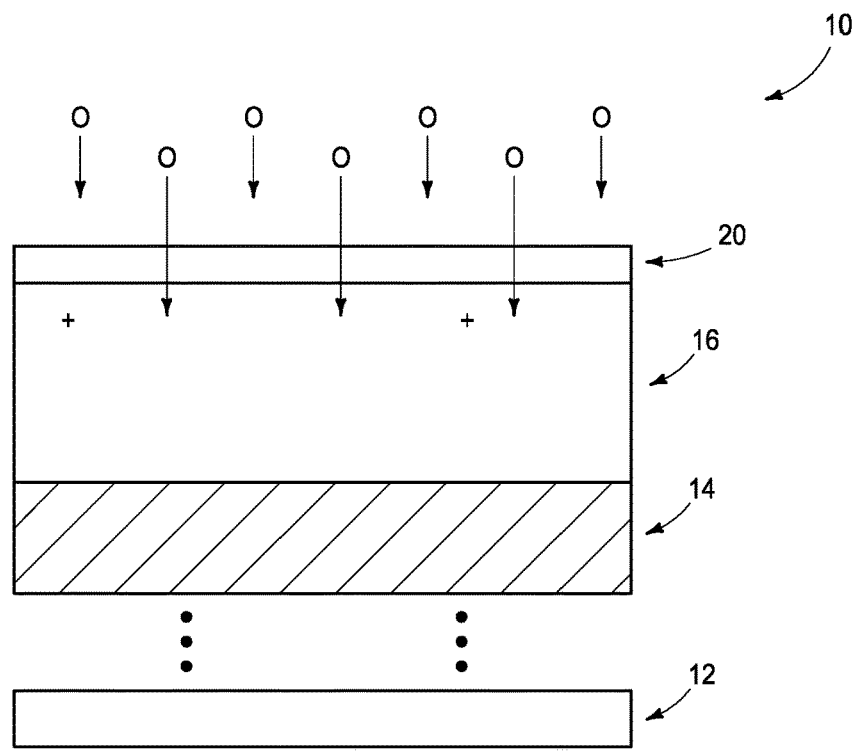

Referring to FIG. 4, construction 10 is exposed to oxygen (represented by the symbol "O"), and such oxidizes the metal-containing material 18 (FIG. 3) to form a metal oxide 20. The oxygen exposure may comprise exposure of construction 10 to air after forming the metal-containing material 18 (FIG. 3), or may comprise any other suitable exposure (for instance, exposure to ozone, hydrogen peroxide, etc.). In some embodiments, the metal-containing material 18 is formed within a chamber under conditions in which oxygen is substantially excluded from being present within an ambient in the chamber; and construction 10 is then removed from the chamber and exposed to air to oxidize material 18 and form the oxide 20. Alternatively, or additionally, construction 10 may be exposed to oxidant in the same chamber utilized to form material 18, with such oxidant being provided after forming material 18; and/or may be transferred to a second chamber after forming material 18 within a first chamber, and may then be exposed to oxidant in the second chamber.

Although material 20 is referred to as a metal oxide, in some embodiments the material 20 may be referred to instead as a "metal-containing material which comprises oxygen" to indicate that the material 20 may or may not have complete stoichiometric saturation with oxygen. For instance, titanium oxide has the stoichiometric formula $TiO_2$; and in some embodiments material 20 may be titanium oxide having full stoichiometric saturation with oxygen so that the titanium oxide has the stoichiometric formula $TiO_2$, while in other embodiments material 20 may be titanium oxide having less than full stoichiometric saturation with oxygen to that the titanium oxide has the stoichiometric formula $TiO_{(2-x)}$, (where x is a number greater than zero).

Some of the oxygen is transferred to the ferroelectric insulative material 16 along an interface adjacent the metal oxide 20, and such oxygen fills oxygen vacancies within material 16 (represented by a reduction of the number of plus symbols (+) in FIG. 4 as compared to FIG. 3); which decreases the amount of oxygen vacancies within the ferroelectric insulative material 16.

The metal oxide 20 may, for example, comprise, consist essentially of, or consist of one or more of titanium oxide, aluminum oxide, ruthenium oxide, niobium oxide and tantalum oxide. Additionally, the metal oxide 20 may include one or more of nitrogen, carbon, silicon and germanium. In some embodiments, it is found that it can be desirable for the metal oxide 20 to comprise, consist essentially of, or consist of titanium oxide.

The metal oxide 20 may comprise any suitable thickness; and in some embodiments may have a thickness of less or equal to about 30 Å. For instance, the metal oxide 20 may have a thickness within a range of from about one monolayer to about 20 Å. The metal oxide 20 may be a continuous layer in some embodiments, and in other embodiments may be a discontinuous film.

Figure 5:
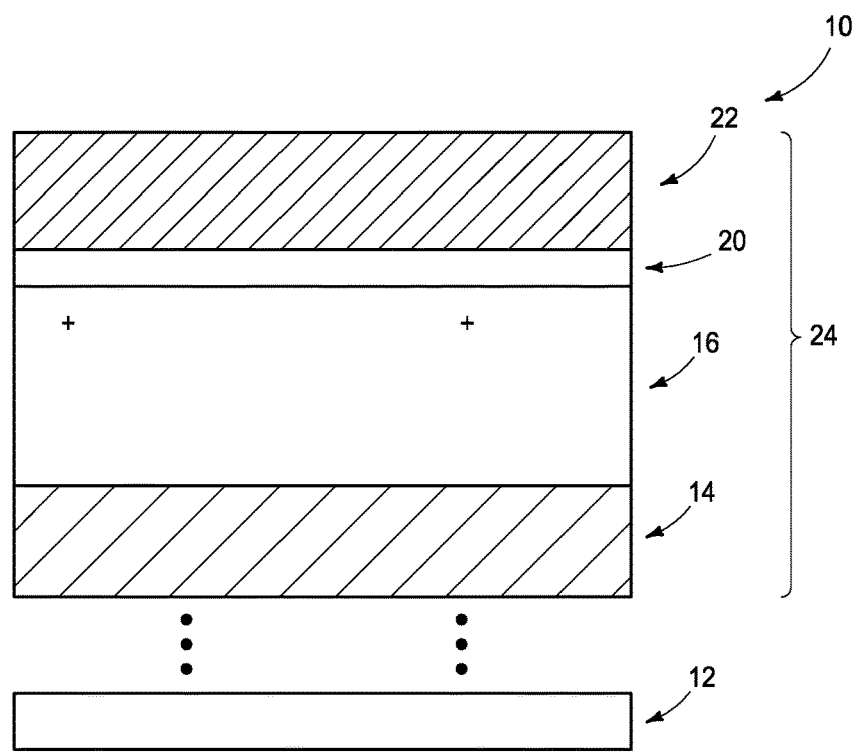

Referring to FIG. 5, an electrode 22 is formed over the metal oxide 20. In some embodiments, the electrodes 14 and 22 may be referred to as first and second electrodes to distinguish the electrodes from one another. Either of the electrodes 14 and 22 may be the first electrode, and the other will be the second electrode. Alternatively, the electrodes 14 and 22 may be referred to as a bottom electrode and a top electrode, respectively; with the bottom electrode being the electrode which is closest to the semiconductor-containing base 12. In some embodiments, the electrodes 14 and 22 may be referred to as capacitor electrodes. The metal oxide 20 may be between an entirety of the electrode 22 and the ferroelectric insulative material 16, or may be between a portion of the electrode 22 and the ferroelectric insulative material 16. Generally, the metal oxide 20 is between at least a portion of the electrode 22 and the ferroelectric insulative material 16.

The electrode 22 may comprise any suitable composition or combination of compositions; such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the electrode 22 may comprise, consist essentially of, or consist of one or more of molybdenum silicide, titanium nitride, titanium silicon nitride, ruthenium silicide, ruthenium, molybdenum, tantalum nitride, tantalum silicon nitride and tungsten.

The electrode 22 may have any suitable thickness, and in some embodiments may have a thickness within a range of from about 10 Å to about 200 Å.

The electrodes 14 and 22 may comprise a same composition as one another in some embodiments, or may comprise different compositions relative to one another. In some embodiments, the electrodes 14 and 22 may both comprise, consist essentially of, or consist of titanium nitride.

The electrodes 14 and 22, together with the insulative material 16 and metal oxide 20 form a ferroelectric assembly 24 (e.g., a ferroelectric capacitor, an FTJ device, etc.). The ferroelectric assembly 24 may have few, if any, oxygen vacancies along an interface between the ferroelectric insulative material 16 and the metal oxide 20. Accordingly, methodology the type described with reference to FIGS. 1-5 may reduce the number of oxygen vacancies within the ferroelectric insulative material of a ferroelectric assembly as compared to conventional methodologies. The reduced number of oxygen vacancies may improve operational aspects of ferroelectric assemblies formed in accordance with methodologies described herein as compared to ferroelectric assemblies formed utilizing conventional methodologies. For instance, it is found that ferroelectric capacitors formed utilizing methodologies described herein may have improved endurance as compared to ferroelectric capacitors formed utilizing conventional methodologies; and in some aspects it is found that the ferroelectric capacitors formed utilizing methodologies described herein may have at least about double the lifetime relative to analogous ferroelectric capacitors formed utilizing conventional methodologies.

Figure 6:
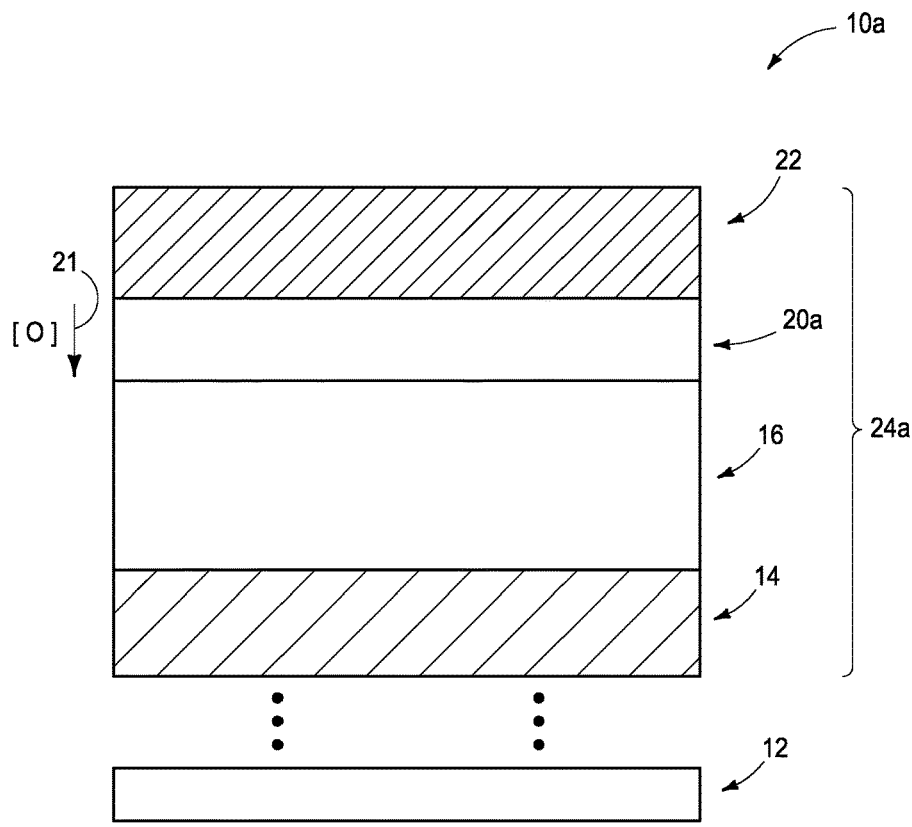
FIG. 6 is a diagrammatic cross-sectional view of a construction comprising an example ferroelectric device.

The metal oxide 20 within the ferroelectric assembly 24 of FIG. 5 is shown to be homogeneous. In other embodiments, the metal oxide may be heterogeneous. For instance, an oxygen concentration throughout the metal oxide 20 may be comprised by a gradient. FIG. 6 shows a construction 10a comprising a metal oxide 20a within a ferroelectric assembly 24a (e.g., a capacitor, an FTJ device, etc.). The metal oxide 20a is shown having an oxygen gradient extending therethrough, with the oxygen concentration being represented as "[O]", and with the illustrated gradient (represented by an arrow 21) showing the oxygen concentration increasing in a direction toward the insulative material 16. The oxygen concentration gradient within the metal oxide 20a may result from a reduction of oxygen along an upper surface of the metal oxide 20a before or during formation of the upper electrode 22, may result from increased oxidation of material 20a along an interface with the insulative material 16 before or after removal of oxygen vacancies from within the insulative material 16, etc.

Figure 7:
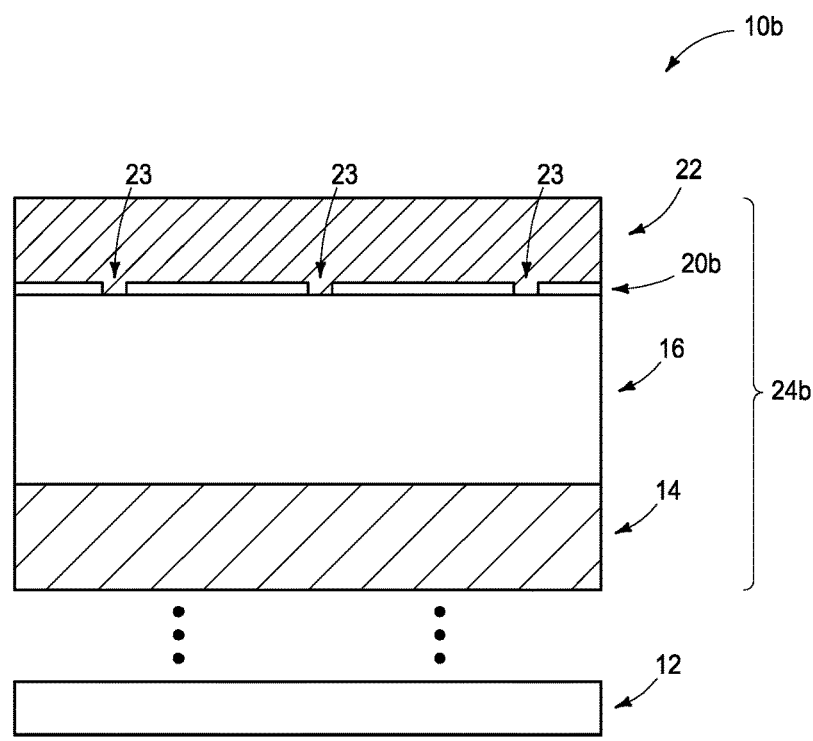
FIG. 7 is a diagrammatic cross-sectional view of a construction comprising an example ferroelectric device.
Figure 8:
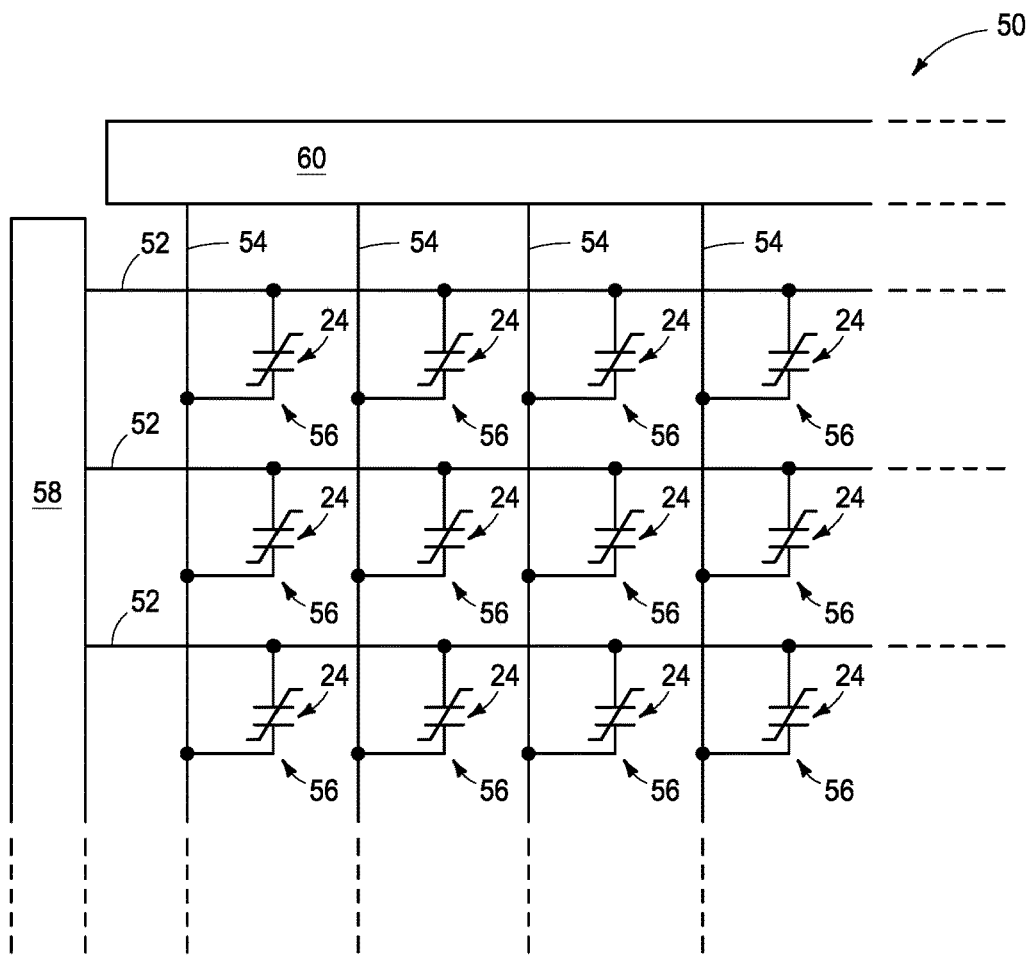
FIG. 8 is a schematic diagram of an example memory array comprising ferroelectric devices.

The embodiment of FIG. 5 shows the metal oxide 20 as a continuous layer. In other embodiments, the metal oxide may be a discontinuous film. For instance, FIG. 7 shows a construction 10b comprising a metal oxide 20b within a ferroelectric assembly 24b (e.g., a capacitor, an FTJ device, etc.); and the metal oxide 20b is configured as a discontinuous film. Openings 23 extend through the discontinuous film of metal oxide 20b in the illustrated embodiment. Such openings may be very small; and, for example, may be pinhole openings in some applications.

In some embodiments, the ferroelectric assemblies described herein (e.g., assembly 24) are capacitors, and such may be incorporated into memory arrays. An example memory array 50 is described with reference to FIG. 8. The memory array includes a plurality of substantially identical ferroelectric capacitors 24. Wordlines 52 extend along rows of the memory array, and digit lines 54 extend along columns of the memory array. Each of the capacitors 24 is within a memory cell 56 which is uniquely addressed utilizing a combination of a wordline and a digit line. The wordlines 52 extend to driver circuitry 58, and the digit lines 54 extend to detecting circuitry 60. In some applications, the memory array 50 may be configured as ferroelectric random access memory (FeRAM).

Figure 9:
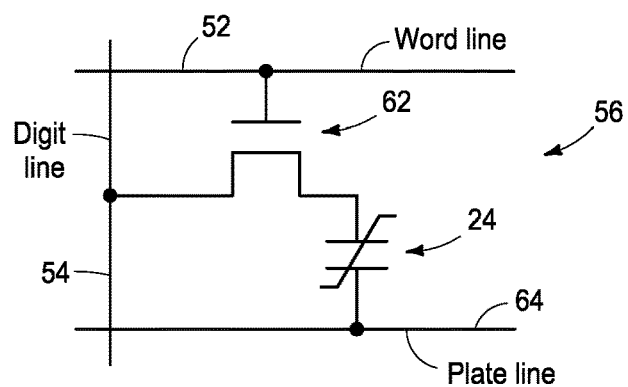
FIG. 9 is a schematic diagram of an example memory cell comprising a ferroelectric capacitor.

The memory cells 56 may include transistors in combination with the ferroelectric capacitors. For instance, in some applications each of the memory cells 56 may include a transistor 62 in combination with a ferroelectric capacitor 24, as shown in FIG. 9. The memory cell 56 is shown coupled with a wordline 52 and a digit line 54. Also, one of the electrodes of the capacitor 24 is shown coupled with a plate line 64 which is utilized in combination with the wordline 52 for controlling an operational state of the ferroelectric capacitor 24.

The embodiments described above for reducing oxygen vacancies may be utilized relative to ferroelectric capacitors or other assemblies. For instance, the assembly 24 of FIG. 5 may correspond to an FTJ device (or analogously, the assemblies 24a and 24b of FIGS. 6 and 7 may correspond to FTJ devices). In such embodiments, the material 16 may be a thin layer of ferroelectric material between the electrodes 14 and 22; and the material 20 may be electrically insulative in some applications, or electrically conductive, depending on its desired influence relative to electrical flow through the assembly. Also, the material 20 may be kept very thin so that it has negligible, or at least nearly negligible) influence on electrical flow through the final structure.

Figure 10:
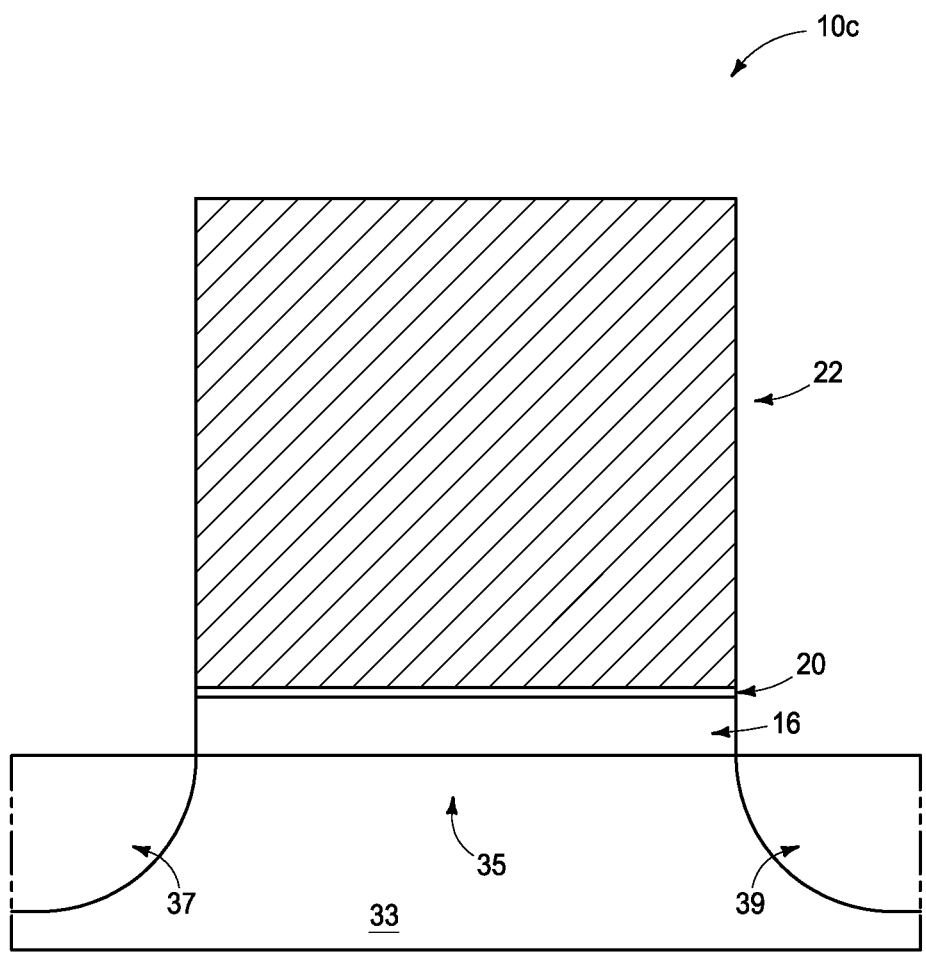
FIG. 10 is a diagrammatic cross-sectional view of a construction comprising an example ferroelectric device.

As another example, assemblies analogous to the assemblies 24, 24a and 24b of FIGS. 5-7 may be utilized as FeFETs, with an example FeFET assembly being shown in FIG. 10 as part of a construction 10c. The material 16 may be a layer of ferroelectric material between a channel region 35 and a gate electrode 22. The channel region (which may also be referred to as a transistor channel region) is between a pair of source/drain regions 37 and 39; and all of the regions 35, 37 and 39 are within a semiconductor base 33 (with such base 33 comprising any suitable semiconductor material, such as, for example, silicon, germanium, III/V material, semiconductor oxides, etc.). Persons of ordinary skill in the art will recognize appropriate dopants and/or materials for the base 33 and regions 35, 37 and 39. The material 20 of the FeFET assembly of construction 10c may be electrically insulative in some applications, or electrically conductive, depending on its desired influence relative to electrical flow through the FeFET assembly. Also, the material 20 may be kept very thin so that it has negligible, or at least nearly negligible) influence on electrical flow through the final structure.

In some embodiments, the constructions 10-10b of FIGS. 5-7 show example ferroelectric capacitors. Although the example capacitors are planar capacitors (i.e., have planar bottom electrodes), it is to be understood that the capacitors may have any suitable configurations; including, for example, container-type configurations (i.e., may have container-shaped bottom electrodes), pillar-type configurations (i.e., may have pillar-shaped bottom electrodes), etc.

The structures discussed above may be incorporated into electronic systems. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include a ferroelectric assembly which has a metal oxide over a ferroelectric insulative material. The metal oxide has a thickness of less than or equal to about 30 Å. A metal-containing electrode is over the metal oxide.

Some embodiments include a capacitor which has ferroelectric insulative material between a first electrode and a second electrode. The capacitor also has a metal oxide between at least a portion of the second electrode and the ferroelectric insulative material. The metal oxide has a thickness of less than or equal to about 30 Å.

Some embodiments include a capacitor which includes ferroelectric insulative material between a first electrode and a second electrode. The capacitor also includes a metal-containing material between at least a portion of the second electrode and the ferroelectric insulative material. The metal-containing material has a thickness of less than or equal to about 30 Å. The metal-containing material includes oxygen and one or more of titanium, aluminum, ruthenium, niobium and tantalum.

Some embodiments include a method of forming an assembly. Ferroelectric insulative material is formed over a semiconductor-containing base. A metal-containing material is formed over the ferroelectric insulative material. The metal-containing material is oxidized to form a metal oxide from the metal-containing material. An electrode is formed over the metal oxide.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A capacitor, comprising:
ferroelectric insulative material between a first electrode and a second electrode, the ferroelectric insulative material being directly against the first electrode, the ferroelectric insulative material comprising one or more members of the group consisting of zirconium, zirconium oxide, niobium, niobium oxide, hafnium, hafnium oxide, and doped transition metal oxide; and
a metal-containing material between at least a portion of the second electrode and the ferroelectric insulative material, the metal-containing material being in direct contact with the second electrode and being in direct contact with the ferroelectric insulative material along an interface, the metal-containing material having an overall thickness of less than or equal to about 30 Å; the metal-containing material including oxygen and at least one metal, the at least one metal consisting of one or more of titanium, aluminum, ruthenium, niobium and tantalum; the oxygen being present at differing concentrations through a thickness of the metal-containing material, with an concentration increasing toward the interface with the ferroelectric insulative material.

2. The capacitor of claim 1 wherein the capacitor is supported by a semiconductor-containing base; and wherein the first electrode is a bottom electrode and the second electrode is a top electrode, with the bottom electrode being closer to the semiconductor-containing base than the top electrode.

3. The capacitor of claim 2 wherein the metal-containing material includes one or more nitrogen, carbon, silicon and germanium.

4. The capacitor of claim 2 wherein the metal-containing material includes titanium and oxygen.

5. The capacitor of claim 4 wherein the first and second electrodes comprise titanium nitride.

6. The capacitor of claim 1 being one of a plurality of substantially identical capacitors within a memory array.

7. The capacitor of claim 1 wherein the metal-containing material is a discontinuous film having openings extending therethrough.

8. The capacitor of claim 7 wherein the second electrode comprises an electrode material that extends within the openings and contacts the ferroelectric insulative material along a base of the openings.

\* \* \* \* \*